(12) United States Patent
Ishiyama

(10) Patent No.: US 7,099,154 B2  
(45) Date of Patent: Aug. 29, 2006

(54) ELECTRONIC APPARATUS WITH A COOLING REDUNDANCY FUNCTION

(75) Inventor: Kazunori Ishiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1 day.

(21) Appl. No.: 10/994,379

(22) Filed: Nov. 23, 2004

(65) Prior Publication Data
US 2006/0044755 A1 Mar. 2, 2006

(30) Foreign Application Priority Data
Aug. 24, 2004 (JP) .............................. 2004-244053

(51) Int. Cl.
*H05K 7/20* (2006.01)
*G06F 1/20* (2006.01)

(52) U.S. Cl. .................. 361/695; 361/687; 165/121; 454/184

(58) Field of Classification Search ............ 361/695, 361/679–687, 726–727; 165/121, 80.3; 454/184
See application file for complete search history.

(56) References Cited

U.S. PATENT DOCUMENTS 6,950,304 B1 * 9/2005 Suzuki et al. ............... 361/687

2003/0016496 A1 * 1/2003 Kim et al. ............... 361/695
2003/0103329 A1 * 6/2003 Tozune et al. ............ 361/695

FOREIGN PATENT DOCUMENTS

JP 8-124375 5/1996

* cited by examiner

*Primary Examiner*—Hung Van Duong
(74) *Attorney, Agent, or Firm*—Armstrong, Kratz, Quintos, Hanson & Brooks, LLP

(57) ABSTRACT

An electronic apparatus includes a shelf part and multiple units mounted in the shelf part. Each unit includes first and second faces opposite each other, a cooling fan, and a third face different from the first and second faces. The first face has an inlet and the second face has an outlet. A cooling fan cools a circuit board inside the unit by letting in cooling air from outside through the inlet and letting out the cooling air through the outlet. The third face has an opening so that the space inside the unit communicates with the space inside the shelf part through the opening.

8 Claims, 14 Drawing Sheets

ELECTRONIC APPARATUS WITH A COOLING REDUNDANCY FUNCTION

BACKGROUND OF THE INVENTION

1. Field of the Invention

The present invention relates generally to electronic apparatuses forming computer systems, and more particularly to a cooling redundancy function suitable for an electronic apparatus in which the same or different multiple units equipped with cooling fans are mounted.

2. Description of the Related Art

As a result of recent developments in computer systems, electronic apparatuses forming computer systems are required to be increased in reliability, and are also required to be reduced in price and size in order to be more competitive on the market. Accordingly, it is necessary to realize highly reliable electronic apparatuses reduced in price and size.

In a conventional electronic apparatus in which the same or different multiple units equipped with cooling are mounted, multiple cooling fans are provided in each unit in order to increase the reliability of the electronic apparatus. For instance, Japanese Laid-Open Patent Application No. 8-124375 discloses such a conventional electronic apparatus in which multiple cooling fans are provided in each unit.

FIG. 1 shows a common electronic apparatus configuration, showing a state before multiple units are mounted in a shelf. FIG. 2 shows a state where multiple units are mounted in the shelf of an electronic apparatus 100 of FIG. 1.

The electronic apparatus 100 of FIG. 1 is, for instance, a computer main body or a magnetic disk unit forming a computer system. An electronic circuit controlling the electronic apparatus 100 is provided in a housing having a front face 102 and a rear face 104, and a shelf part 101 is formed in the electronic apparatus 100. Two shelf part inlets 103 are formed in the front-side end face of the shelf part 101 in the electronic apparatus 100. The shelf part inlets 103 are formed so as to communicate with the outside of the electronic apparatus 100 through the internal mechanism of the electronic apparatus 100.

The shelf part 101 is sectioned into multiple unit mounting parts 105 so as to receive the same or different multiple units equipped with cooling fans. In the case of FIG. 1, the two unit mounting parts 105 are formed to receive two units.

As shown in FIG. 2, two units 10 are mounted in the shelf part 101 of the electronic apparatus 100. As described above, multiple cooling fans are provided in each unit 10 in the conventional electronic apparatus in order to increase reliability. A description is given herein, with reference to FIGS. 3A and 3B, of the configuration of each unit 10.

FIGS. 3A and 3B are perspective views of the configuration of one of the units 10 to be mounted in a conventional electronic apparatus. FIG. 3A shows the front-side appearance of the unit 10, and FIG. 3B shows the rear-side appearance of the unit 10.

The unit 10 shown in FIGS. 3A and 3B is, for instance, a power supply unit to be mounted in a computer main body. The unit 10 includes two cooling fans (not graphically illustrated) to provide a cooling redundancy function. The unit 10 includes an inlet 3 formed in a front face 2, two outlets 5 formed in a rear face 4 opposite the front face 2, and the two cooling fans. The cooling fans draw in cooling air from outside through the inlet 3 and expel the air to and through the outlets 5, thereby cooling a circuit board inside the unit 10.

Next, a description is given of the cooling redundancy function in a case where one of the cooling fans of one of the units 10 shown in FIGS. 3A and 3B fails while the other cooling fans are operating normally in a conventional electronic apparatus including the multiple units 10.

FIG. 4 is a diagram for illustrating the flow of cooling air in the multiple units 10 when the cooling fans are operating normally in the conventional electronic apparatus. FIG. 5 is a diagram for illustrating the flow of cooling air in the multiple units 10 when one of the cooling fans fails in the conventional electronic apparatus.

As shown in FIG. 4, when all the cooling fans are operating normally, in each unit 10, outside air from the corresponding shelf part inlet 103 of the electronic apparatus 100 is drawn in through the inlet 3 (inlet air $3a$) and expelled to and through the outlets 5 (outlet air $5a$). As a result, cooling air $6a$ flows through each unit 10 to cool a circuit board therein.

As shown in FIG. 5, when one of the cooling fans fails, in the unit 10 in which the failure occurs, the cooling air $6a$ hardly flows to the outlet 5 on the side of the failed cooling fan, but the cooling air $6a$ flows to the outlet 5 on the side of the cooling fan that is operating normally. Accordingly, in the unit 10 in which one of the cooling fans fails, it is possible to ensure a circuit board cooling function to some extent using the other cooling fan. A function for cooling each unit mounted in an electronic apparatus at the time of cooling fan failure as described above is referred to as the cooling redundancy function. However, the flow rate of the cooling air $6a$ ensured by the cooling redundancy function in the unit 10 in which one of the cooling fans fails is reduced compared with the flow rate of the cooling air $6a$ when the two cooling fans operate normally.

As described above, in the conventional electronic apparatus, two or more cooling fans including a cooling fan for cooling redundancy are mounted in each unit as a method of providing the cooling redundancy function for multiple units. However, in exchange for an improvement in reliability due to the cooling redundancy function, the mounting of multiple cooling fans in each unit causes an increase in the size of the apparatus as well as an increase in the noise and the price of the apparatus due to an increase in the number of cooling fans.

SUMMARY OF THE INVENTION

Accordingly, it is a general object of the present invention to provide an electronic apparatus in which the above-described disadvantages are eliminated.

A more specific object of the present invention is to provide a cooling redundancy function for multiple cooling fans with simple structure in an electronic apparatus in which the same or different multiple units equipped with cooling fans are mounted, and to realize reduction in the price, size, and noise of the electronic apparatus.

The above objects of the present invention are achieved by an electronic apparatus including a shelf part; a plurality of units mounted in the shelf part, each unit including: first and second faces opposite each other, the first face having an inlet and the second face having an outlet; a cooling fan configured to cool a circuit board inside the unit by letting in cooling air from outside through the inlet and letting out the cooling air through the outlet; and a third face different from the first and second faces, the third face having an opening so that a space inside the unit communicates with a space inside the shelf part through the opening.

The above objects of the present invention are also achieved by a unit to be mounted in a shelf of an electronic apparatus including: first and second faces opposite each other, the first face having an inlet and the second face having an outlet; a cooling fan configured to cool a circuit board inside the unit by letting in cooling air from outside through the inlet and letting out the cooling air through the outlet; and a third face different from the first and second faces, the third face having an opening so that a space inside the unit communicates with a space outside the unit through the opening.

Thus, according to the present invention, in an electronic apparatus receiving two or more units in a shelf part thereof, an opening through which the space inside each unit communicates with the space inside the shelf part is formed in one or more third faces of the unit, the third faces being different from the front and rear faces of the unit. As a result, it is possible to reduce the number of cooling fans mounted in each unit to one while ensuring the cooling redundancy function for the multiple units. Accordingly, it is possible to realize an electronic apparatus reduced in size, noise, and price while maintaining its high reliability. There is no need to attach a cooling fun for redundancy to each unit as a method of providing the cooling redundancy function for the multiple units mounted in the electronic apparatus. Therefore, an electronic apparatus reduced in price, size, and noise can be realized with simple structure. In the case of a large-scale computer system, it is possible to avoid system failure even if several cooling fans fail simultaneously. Thus, a low-cost electronic apparatus with a highly reliable cooling redundancy function can be provided.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Next, a description is given, with reference to the accompanying drawings, of embodiments of the present invention. In the following drawings, the same elements as those described above are referred to by the same numerals, and a description thereof is omitted.

Figure 6:
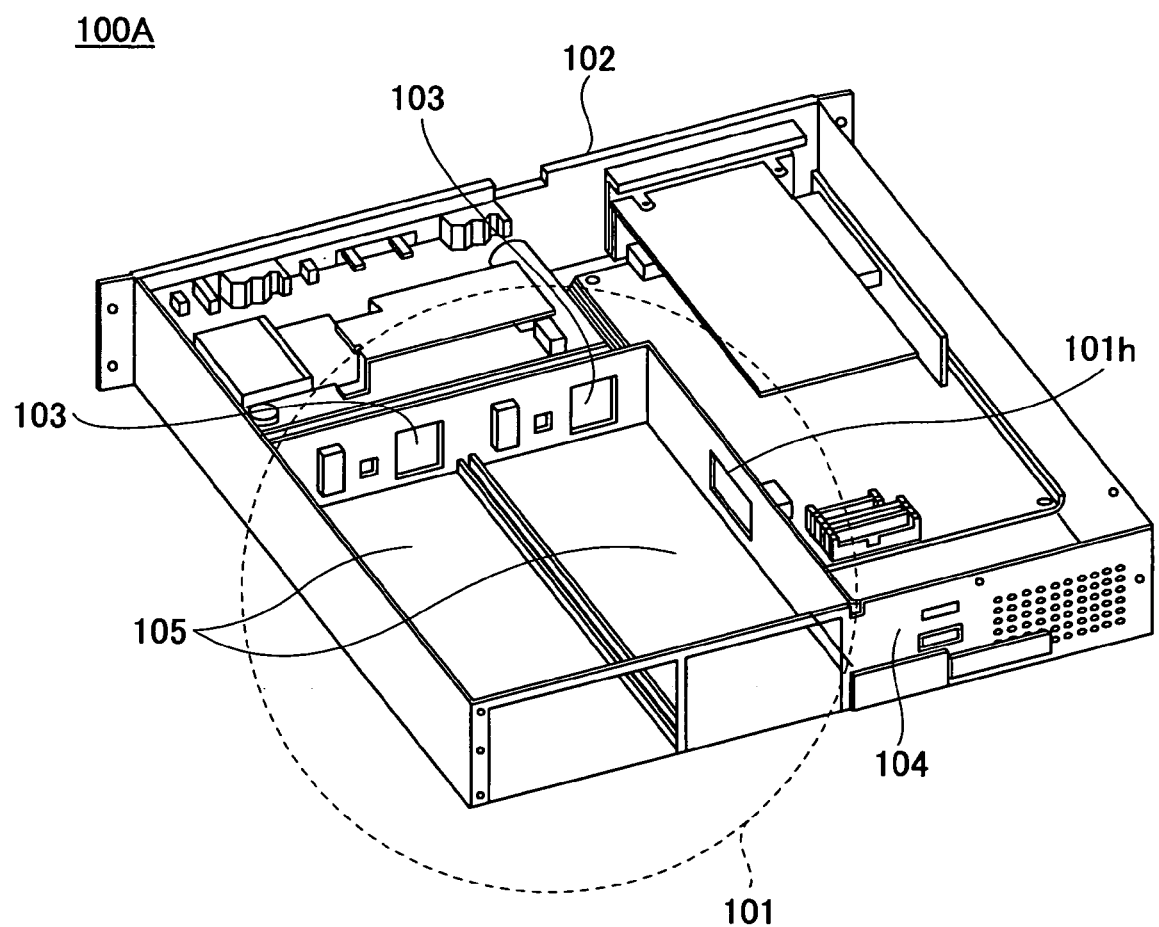
FIG. 6 is a perspective view of an electronic apparatus according to a first embodiment of the present invention, showing a state before multiple units according to this embodiment are mounted in a shelf part thereof.
Figure 7:
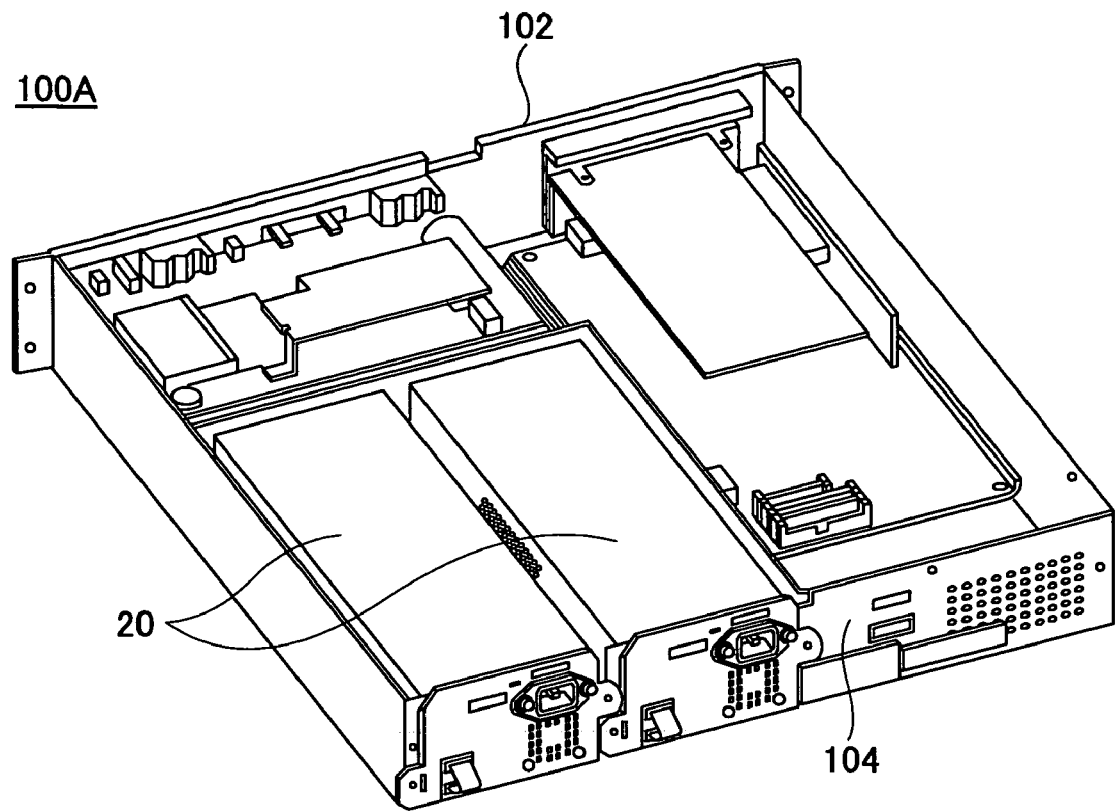
FIG. 7 is a perspective view of the electronic apparatus, showing a state where the multiple units are mounted in the shelf part thereof according to the first embodiment of the present invention.

FIG. 6 is a perspective view of an electronic apparatus 100A according to a first embodiment of the present invention, showing a state before multiple units 20 according to this embodiment are mounted in the shelf part 101. FIG. 7 shows a state where the multiple units 20 are mounted in the shelf part 101 of the electronic apparatus 100A of FIG. 6.

Figure 8A:
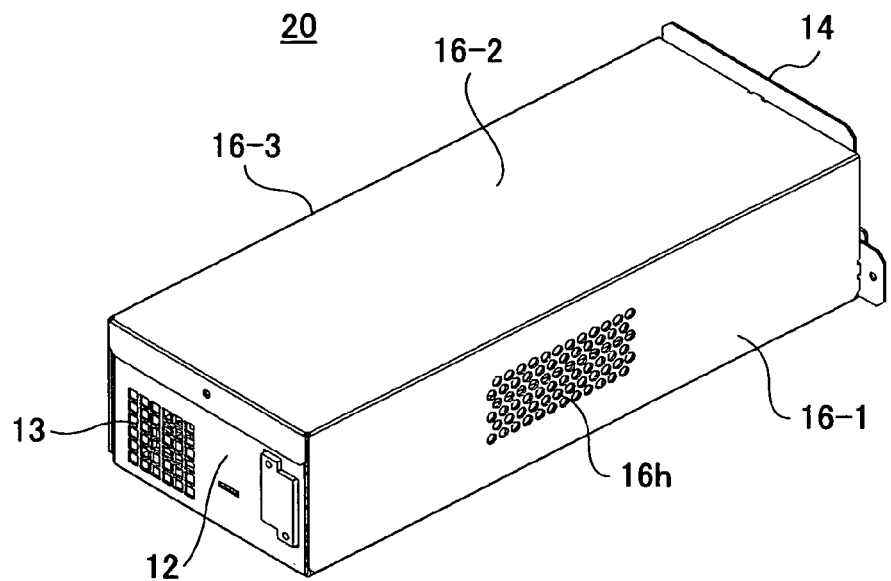
FIGS. 8A and 8B are perspective views of one of the multiple units mounted in the electronic apparatus according to the first embodiment of the present invention.
Figure 8B:
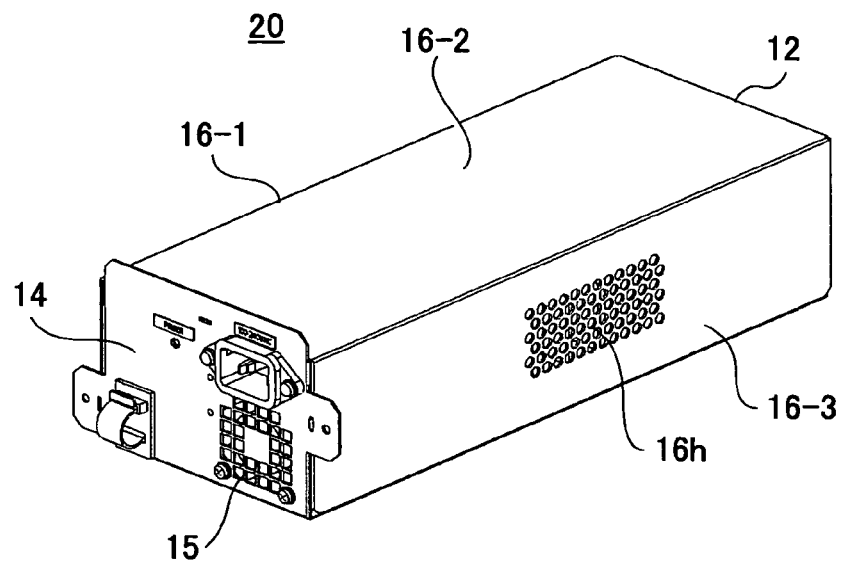

FIGS. 8A and 8B are top perspective views of one of the multiple units 20 to be mounted in the electronic apparatus 100A according to this embodiment, showing the configuration thereof. FIG. 8A shows the front-side appearance of the unit 20, and FIG. 8B shows the rear-side appearance of the unit 20.

In the illustrated embodiment, the multiple units 20 are mounted parallel to each other in the shelf part 101 of the electronic apparatus 100A as shown in FIG. 7.

The unit 20 shown in FIGS. 8A and 8B is, for instance, a power supply unit to be mounted in a computer main body. The unit 20 includes a single cooling fan 18 (FIG. 9) to provide the cooling redundancy function. The unit 20 includes an inlet 13 formed in a front wall or face 12, an outlet 15 formed in a rear wall or face 14 opposite the front face 12, and the single cooling fan 18. The cooling fan 18 draws in cooling air from outside through the inlet 13 and expels the air to and through the outlet 15, thereby cooling a circuit board 11 (FIG. 9) in the unit 20. The unit 20 further has an opening for cooling redundancy (a cooling redundancy opening) 16h formed in one or more third walls or faces 16 different from the front face 12 and the rear face 14.

In the case of the unit 20 of FIGS. 8A and 8B, the third face 16 may refer to any of a side face 16-1, an upper face 16-2, a side face 16-3, and a lower face (hidden from view), which are the faces different from the front face 12 and the rear face 14 in which the cooling redundancy opening 16h is formable. In the illustrated embodiment, the cooling redundancy opening 16h is formed in each of the side faces 16-1 and 16-3 as described below.

With the multiple units 20 being mounted in the shelf part 101 of the electronic apparatus 100A, the cooling redundancy openings 16h are formed in a part of each unit 20 which part is not closed by the adjacent unit 20 or the inner wall part of the electronic apparatus 100A so that the space inside each unit 20 constantly communicates with the space (outside the unit 20) inside the shelf part 101 of the electronic apparatus 100A through the cooling redundancy openings 16h.

In the embodiment shown in FIGS. 8A and 8B, each of the right and left side faces 16-1 and 16-3 of the unit 20 has the corresponding cooling redundancy opening 16h formed therein. Each cooling redundancy opening 16h comprises multiple small holes through which the space inside the unit 20 communicates with the space (outside the unit 20) inside the shelf part 101 of the electronic apparatus 100A.

As illustrated, the unit 20 has a substantially rectangular parallelepiped shape (outer form). Alternatively, the unit 20 may have other shapes including a cylindrical or polyhedral shape.

Figure 9:
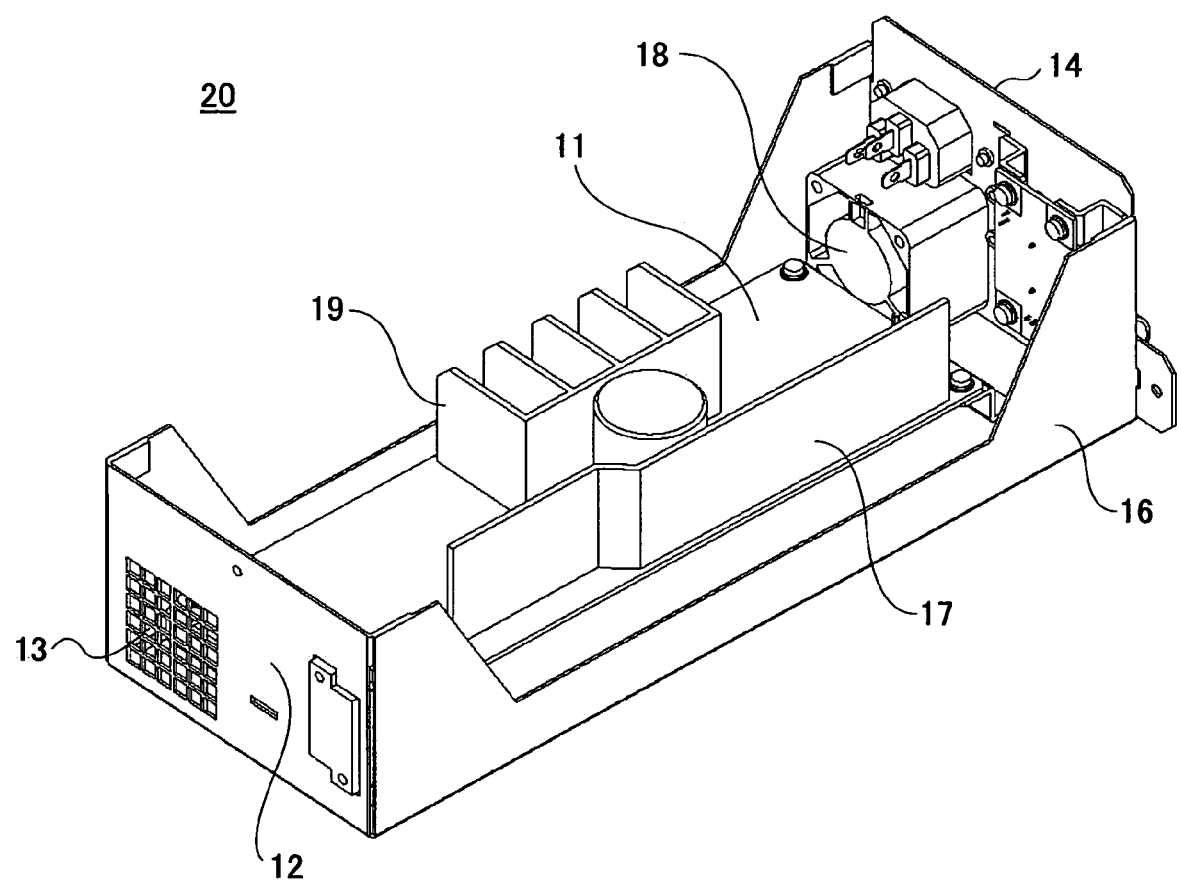
FIG. 9 is a perspective view of the unit, showing an internal structure thereof according to the first embodiment of the present invention.

FIG. 9 is a perspective view of the unit 20 according to this embodiment, showing an internal structure thereof.

As shown in FIG. 9, in the unit 20, the circuit board 11 is attached to the bottom face of a housing having the front face 12 and the rear face 14, and the cooling fan 18 is provided in a position corresponding to the outlet 15 of the rear face 14. Further, in the unit 20, a cooling air guide plate 19 and a cooling air guide plate 17 are provided in a central part and a peripheral part, respectively, of the circuit board 11.

When the cooling fan 18 operates normally with the units 20 being mounted in the shelf part 101 of the electronic apparatus 100A, in each unit 20, outside air from the corresponding shelf part inlet 103 (FIG. 6) of the electronic apparatus 100A is drawn in through the inlet 13 and expelled to and through the outlet 15. As a result, cooling air that cools the circuit board 11 flows through each unit 20. The cooling air guide plate 17 and the cooling air guide plate 19 serve to control the direction of the cooling air so that the cooling air flows through a predetermined circuit part on the circuit board 11 with efficiency.

Next, a description is given of the cooling redundancy function in a case where in the electronic apparatus 100A in which the multiple units 20 are mounted in the same shelf part 101, the cooling fan 18 fails in one of the multiple units 20 while the cooling fans 18 of the other units 20 are operating normally.

Figure 10:
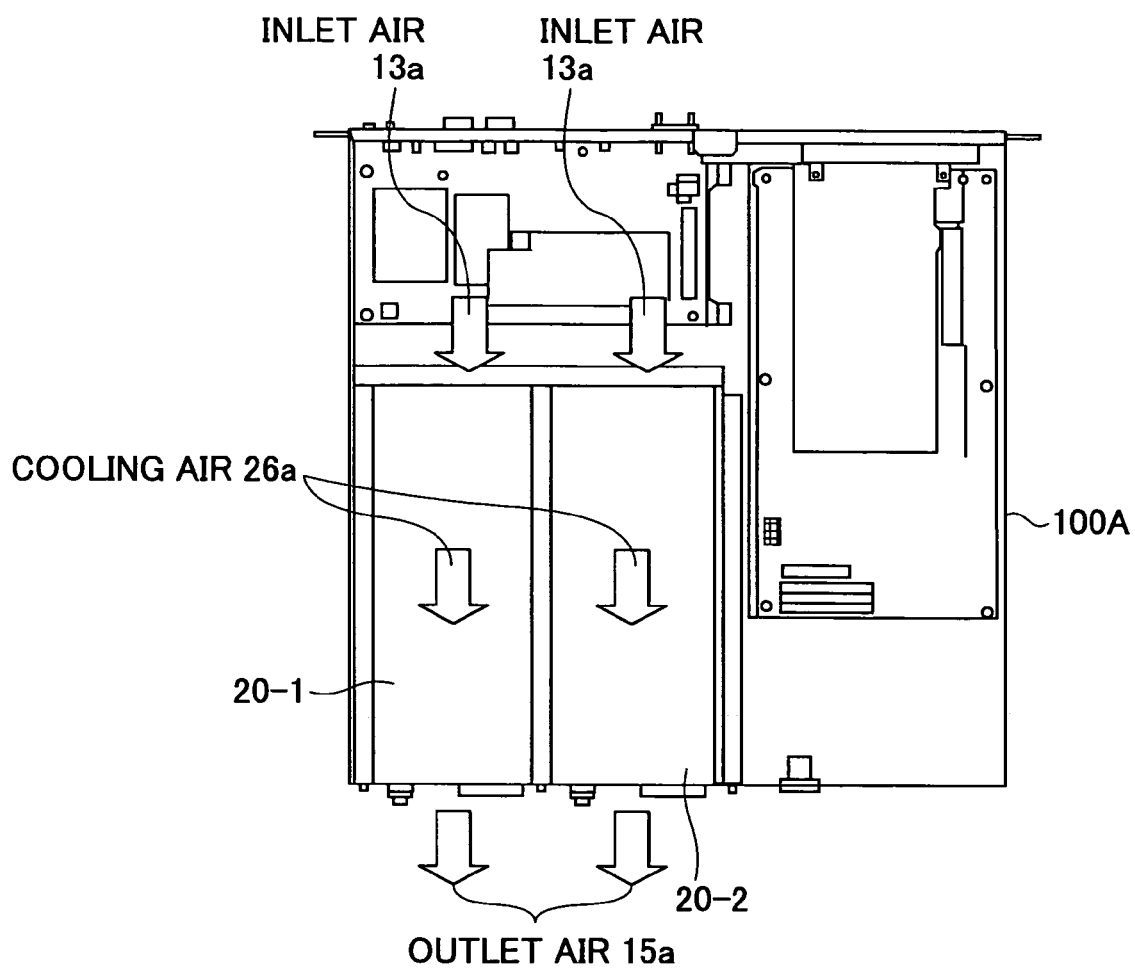
FIG. 10 is a diagram for illustrating the flow of cooling air in the multiple units when the cooling fans are operating normally in the electronic apparatus according to the first embodiment of the present invention.
Figure 11:
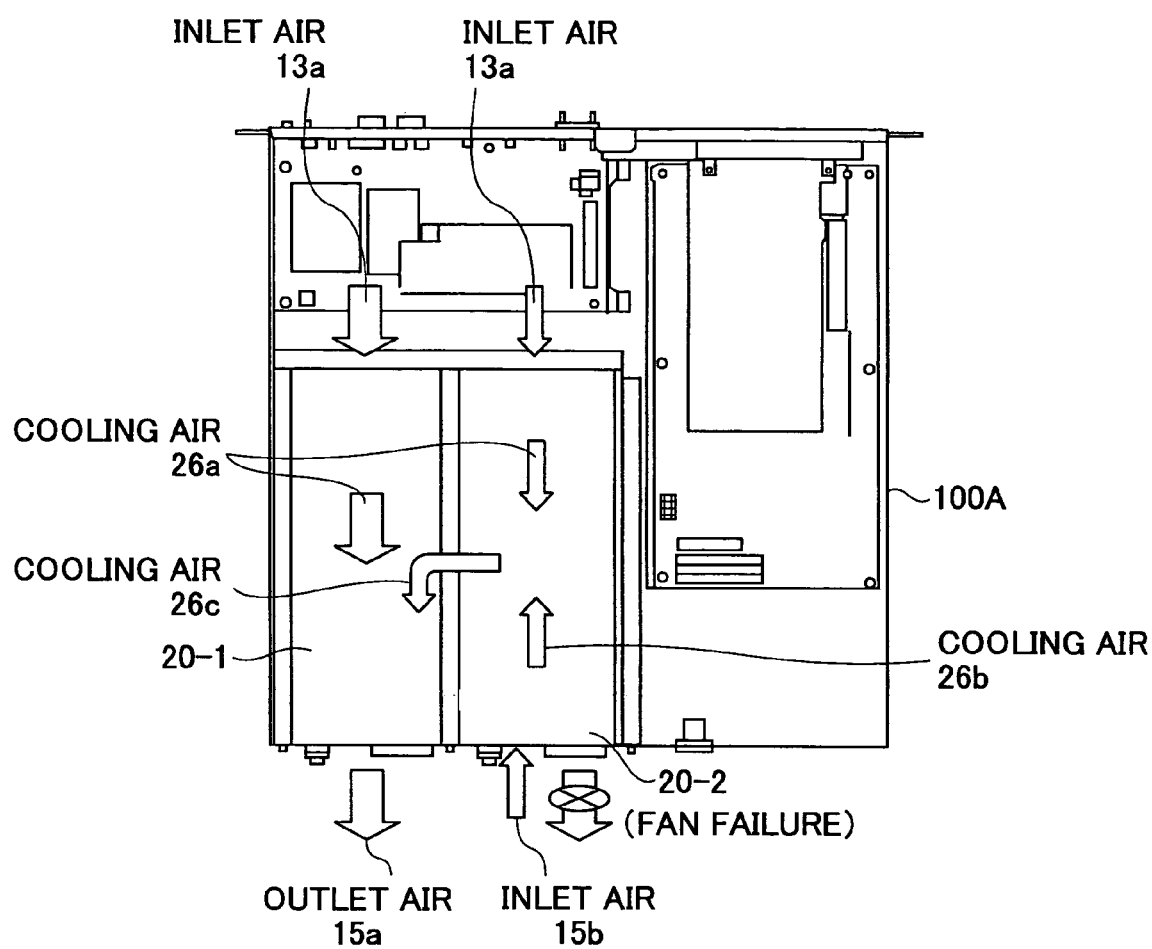
FIG. 11 is a diagram for illustrating the flow of cooling air in the multiple units when there is a cooling fan failure in the electronic apparatus according to the first embodiment of the present invention.

FIG. 10 is a diagram for illustrating the flow of cooling air in the multiple units 20 when the cooling fans 18 are operating normally in the electronic apparatus 100A according to this embodiment. FIG. 11 is a diagram for illustrating the flow of cooling air in the multiple units 20 when there is a cooling fan failure in the electronic apparatus 100A according to this embodiment.

As shown in FIG. 10, when all the cooling fans 18 are operating normally, in each of the units 20 (20-1 and 20-2), outside air from the corresponding shelf part inlet 103 of the electronic apparatus 100 is let in through the inlet 13 (inlet air 13a) and let out to and through the outlet 15 (outlet air 15a). As a result, cooling air 26a flows through each unit 20 to cool the circuit board 11 therein. Here, the cooling redundancy openings 16h formed in the third faces 16 of the adjacent units 20 are positioned opposite each other, or more specifically, the cooling redundancy opening 16h formed in the third face 16 (16-3) of the units 20-1 and the cooling redundancy opening 16h formed in the third face 16 (16-1) of the adjacent unit 20-2 are positioned opposite each other, so as to have the internal space of each of the units 20-1 and 20-2 communicating with the internal space of the shelf part 101.

As shown in FIG. 11, when the cooling fan 18 of the unit 20-2 fails, a difference in pressure is generated between the failed unit 20-2 and the other unit 20-1, whose cooling fan 18 operates normally. This difference in pressure causes the normally operating cooling fan 18 of the other unit 20-1 to start to draw in air through the inlet 13 and the outlet 15 of the failed unit 20-2 via the space inside the shelf part 101 (the inlet air 13a and inlet air 15b). In both units 20-1 and 20-2, the spaces inside the units 20-1 and 20-2 communicate with the space (outside the units 20-1 and 20-2) inside the shelf part 101 through the cooling redundancy openings 16h. Accordingly, the cooling air 26a and cooling air 26b flow from the unit 20-2 with the failed cooling fan 18 to the other unit 20-1 whose cooling fan 18 is operating normally (cooling air 26c) through the cooling redundancy openings 16h and the space (outside the units 20-1 and 20-2) inside the shelf part 101. As a result, it is possible to continue cooling the inside of the unit 20-2 having the failed cooling fan 18.

That is, it is possible to ensure the function of cooling the internal circuit board 11 in the unit 20-2 having the failed cooling fan 18 by using the cooling fan 18 of the other unit 20-1. Accordingly, by mounting the multiple units 20 each having the single cooling fan 18 according to this embodiment in the electronic apparatus 100A, the cooling redundancy function can be realized with simple structure.

According to this embodiment, as shown in FIG. 7, the multiple units 20 for which cooling redundancy is desired to be provided are mounted in the same shelf part 101. As shown in FIG. 9, the single cooling fan 18 is attached to each unit 20. The cooling redundancy openings 16h are formed in the corresponding third faces 16 different from the face on which the cooling fan 18 is attached (the rear face 14) and the face in which the inlet 13 is formed (the front face 12). In the illustrated embodiment, an opening 101h (FIG. 6) for drawing in cooling air is formed at a position corresponding to a corresponding one of the cooling redundancy openings 16h (the cooling redundancy opening 16h formed in the third face 16 [16-3] of the unit 20-2 in this case) in the shelf part 101 of the electronic apparatus 100A. This opening 101h may comprise multiple small holes as the cooling redundancy openings 16h. The space inside each unit 20 communicates with the space (outside the unit 20) inside the shelf part 101 through the cooling redundancy openings 16h formed in the third faces 16 (16-1 and 16-3 in this embodiment) different from the rear face 14 and the front face 12 of the unit 20. As shown in FIG. 6, the shelf part inlets 103, which are formed in the front-side end face of the shelf part 101, communicate with the outside of the electronic apparatus 100A through the other internal mechanism of the electronic apparatus 100A. That is, the space inside the shelf part 101 communicates with the outside of the electronic apparatus 100A through the shelf part inlets 103. Meanwhile, the internal space of each unit 20 communicates with the outside of the shelf part 101 via the cooling redundancy openings 16h, the inlet 13, and the outlet 15 of the unit 20.

As shown in FIGS. 10 and 11, the flow rate of cooling air ensured by the cooling redundancy function in the case of the failure of the cooling fan 18 of one of the units 20 is reduced compared with the case where the cooling fans 18 of both units 20 operate normally. Sufficient cooling effect can be ensured by selecting a suitable cooling fan in consideration of the time of cooling redundancy for the cooling fan 18 employed in each unit 20 according to this embodiment.

Figure 1:
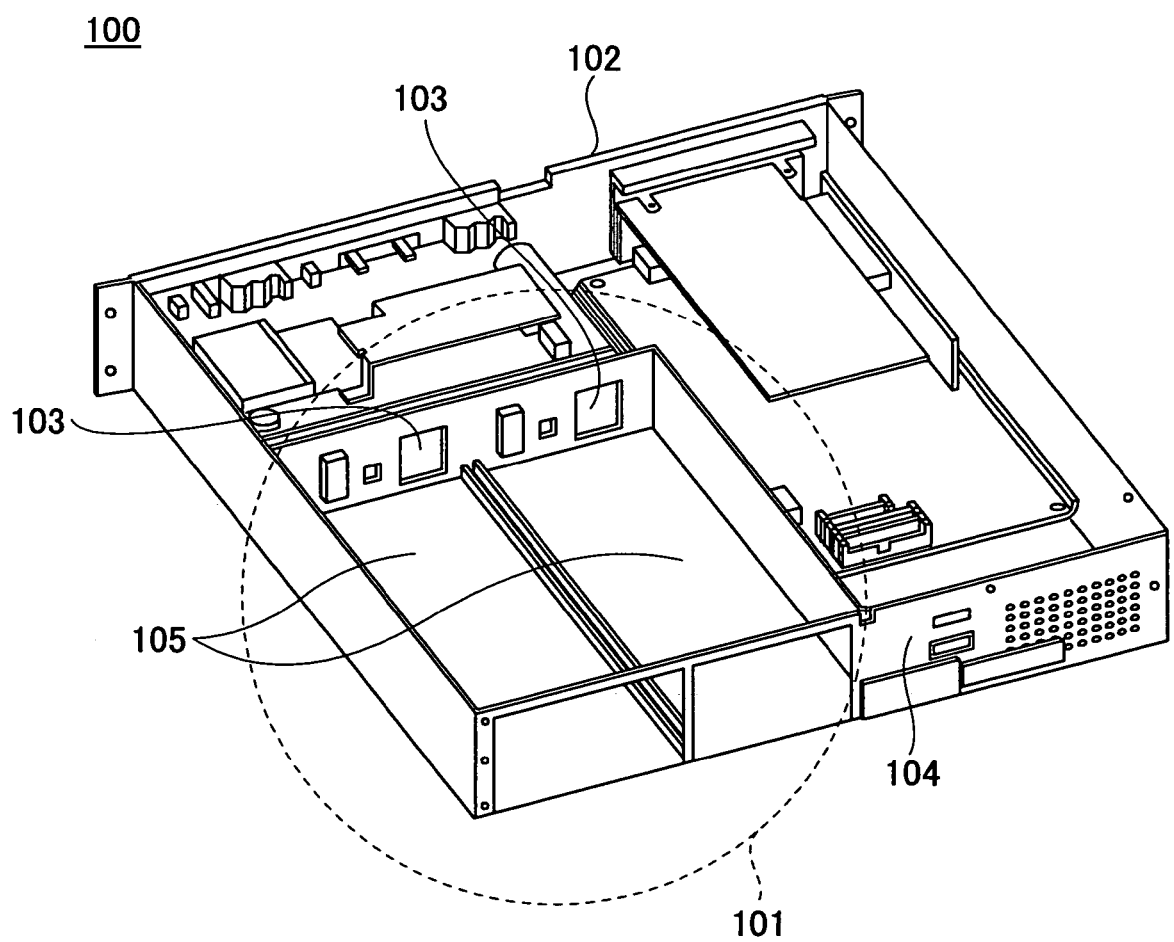
FIG. 1 is a perspective view of a conventional electronic apparatus in a state before multiple units are mounted in a shelf part thereof.
Figure 2:
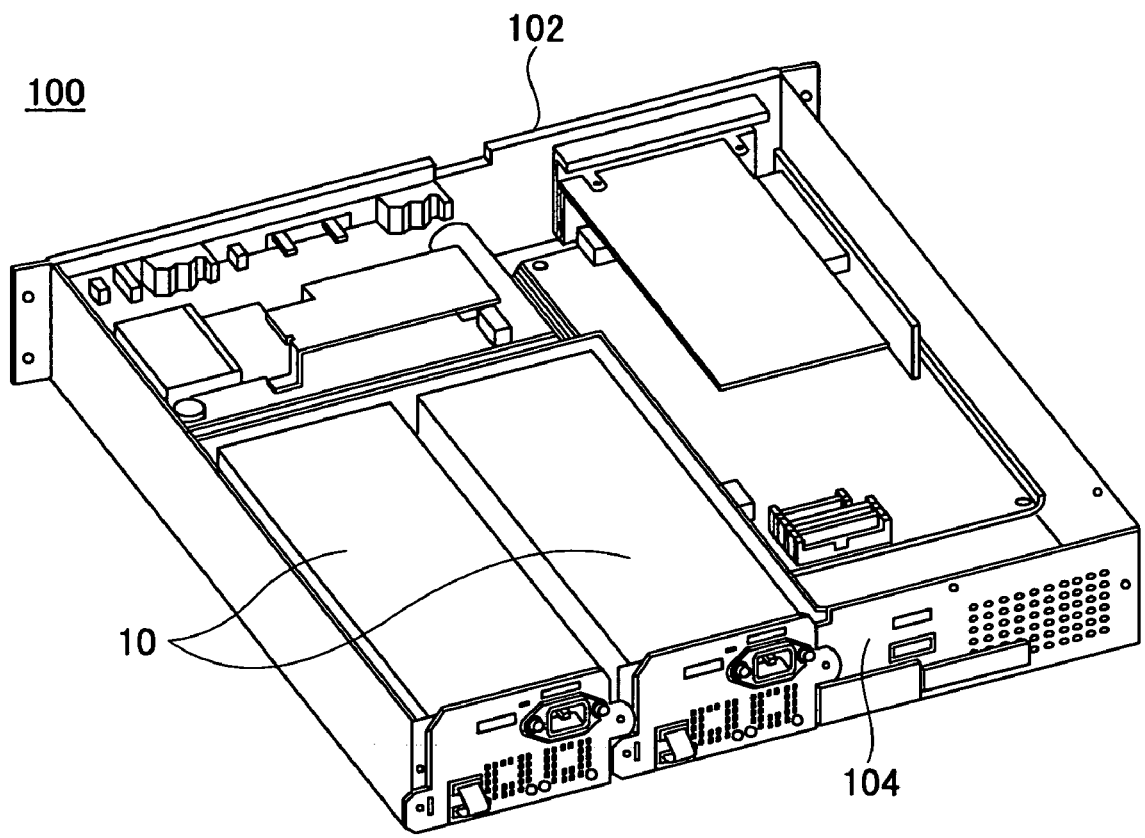
FIG. 2 is a perspective view of the conventional electronic apparatus in which the multiple units are mounted in the shelf part thereof.
Figure 3A:
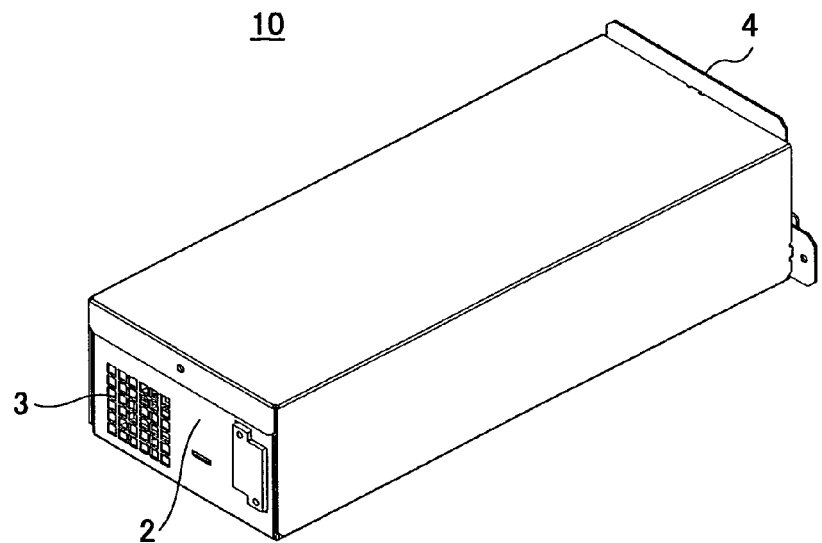
FIGS. 3A and 3B are perspective views of one of the units mounted in the conventional electronic apparatus.
Figure 3B:
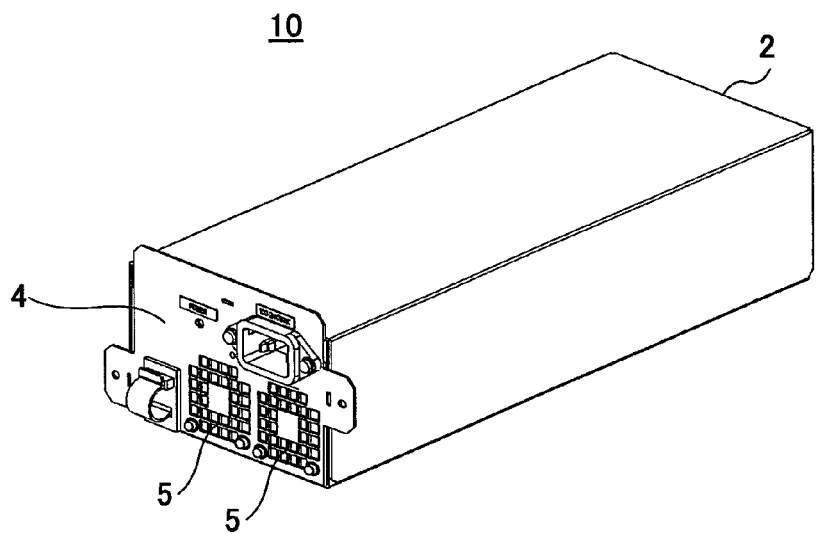
Figure 4:
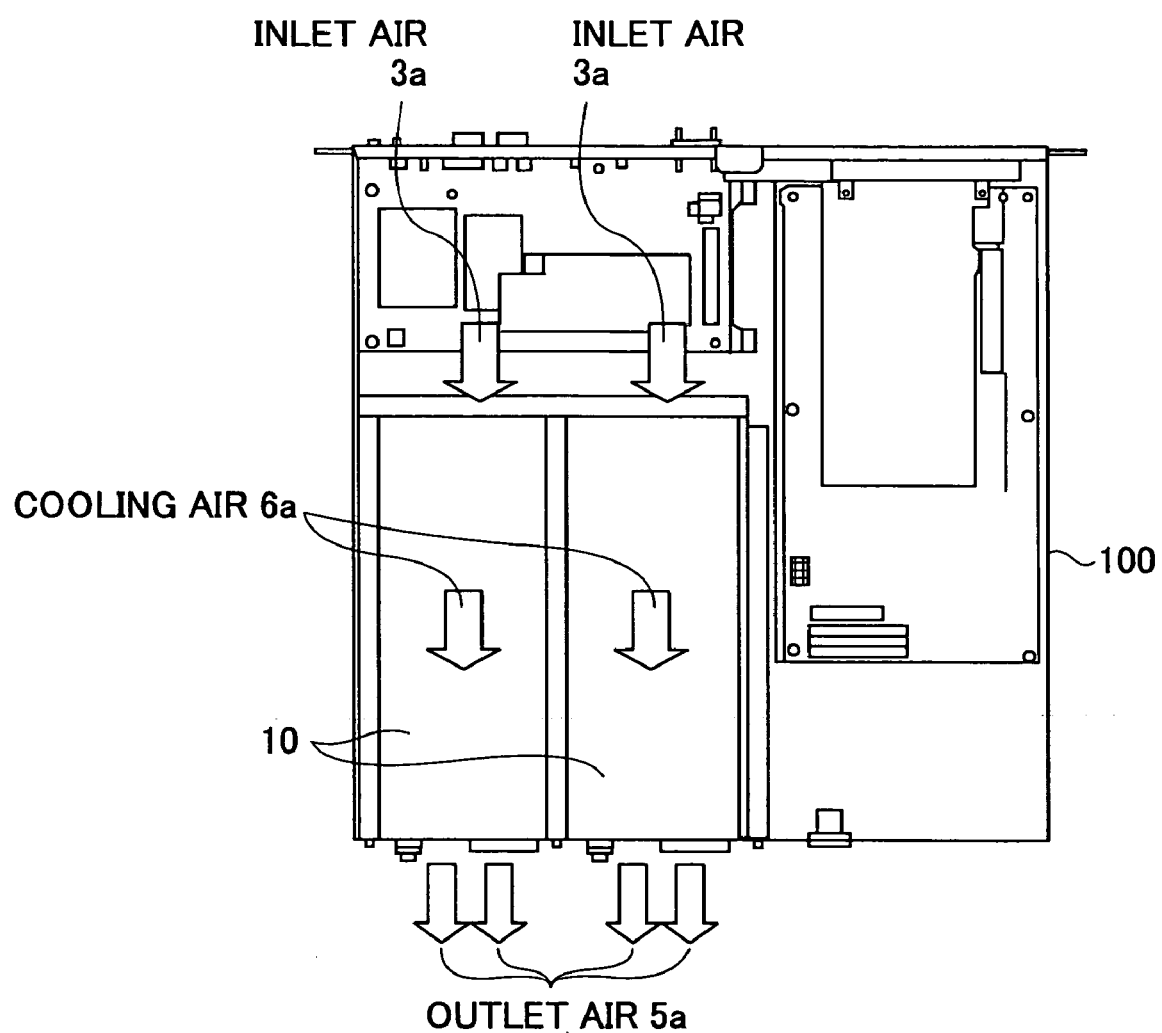
FIG. 4 is a diagram for illustrating the flow of cooling air in the multiple units when cooling fans are operating normally in the conventional electronic apparatus.
Figure 5:
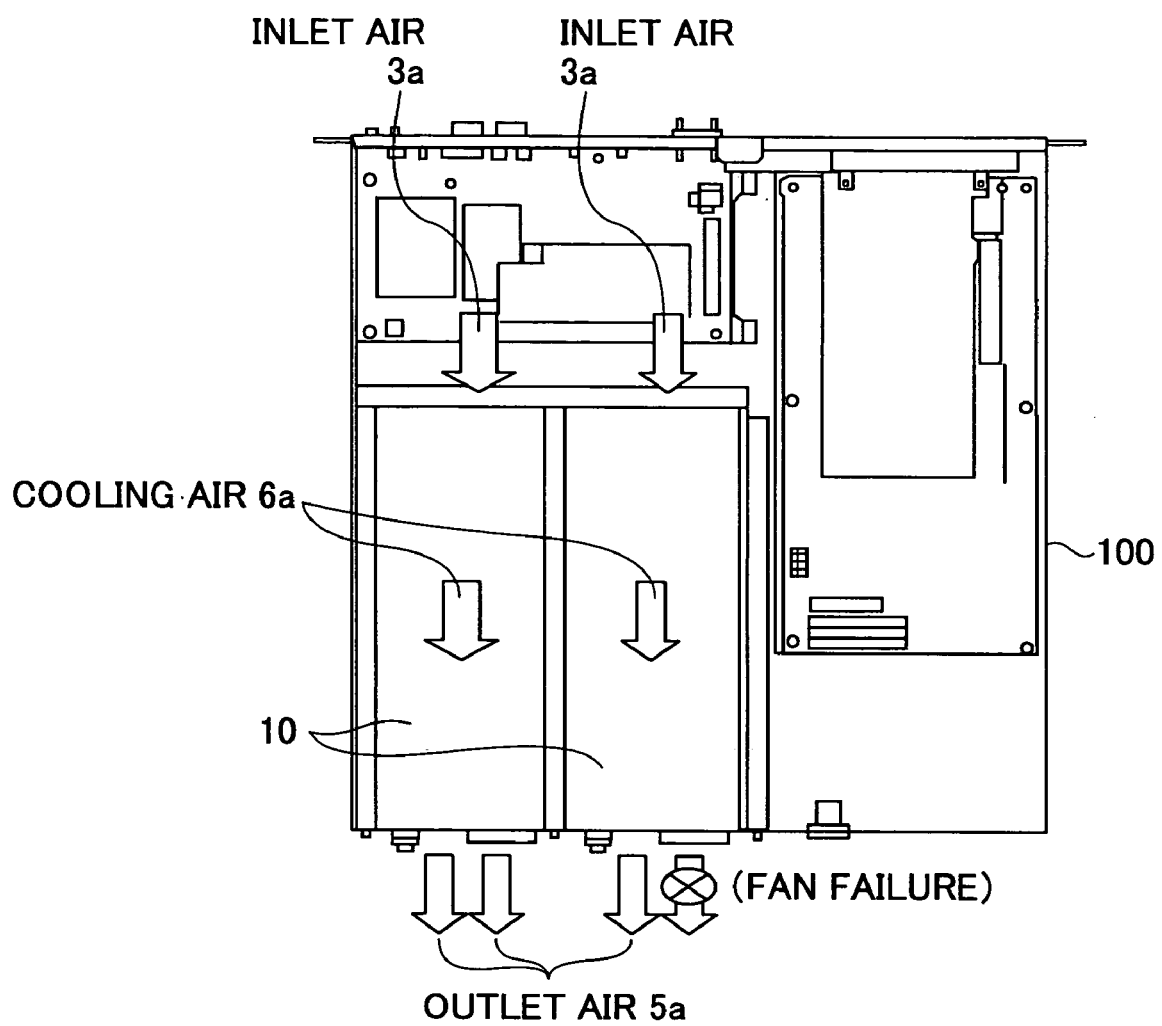
FIG. 5 is a diagram for illustrating the flow of cooling air in the multiple units when one of the cooling fans fails in the conventional electronic apparatus.

The simultaneous failure of two or more of the cooling fans 18 rarely occurs. Therefore, according to this embodiment, highly reliable redundancy can be ensured. In this case, when one of the cooling fans 18 fails, the unit 20 with the failed cooling fan 18 can obtain greater cooling effect as the number of units 20 mounted in the same shelf part 101 of the electronic apparatus 100A increases. As a result, it is possible to reduce loads imposed on the other units 20 whose cooling fans 18 are operating normally. Further, the number of cooling fans 18 used in each unit 20 is halved compared with each of the units 10 mounted in the conventional electronic apparatus 100 shown in FIGS. 3A and 3B. Accordingly, the unit 20 according to this embodiment enables reduction in size and cost.

Figure 12A:
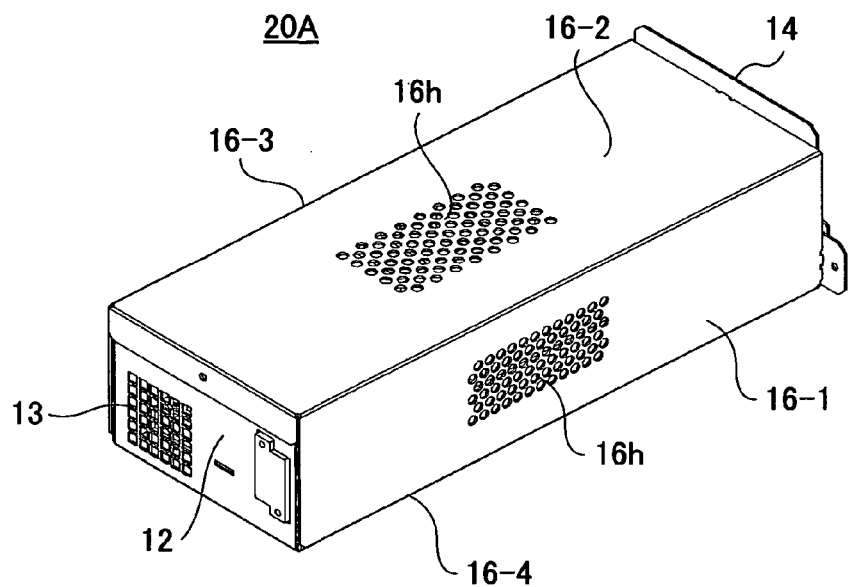
FIGS. 12A and 12B are perspective views of one of multiple units mounted in the electronic apparatus according to a second embodiment of the present invention.
Figure 12B:
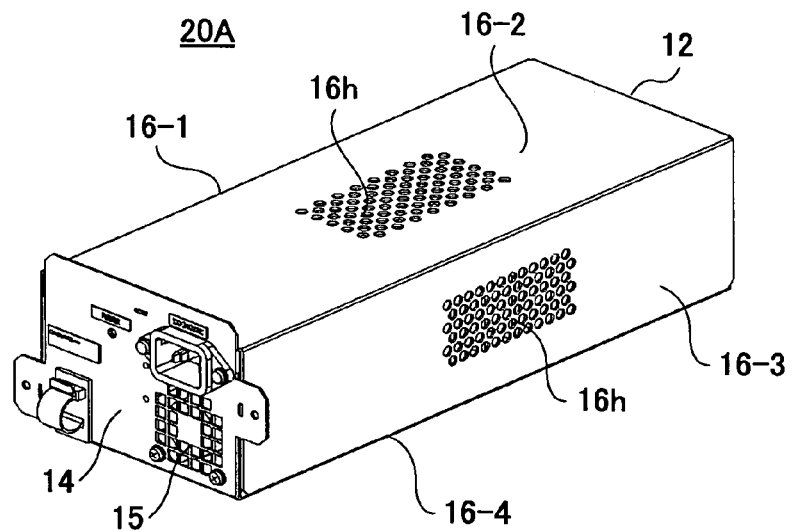

FIGS. 12A and 12B are top perspective views of one of multiple units 20A to be mounted in the electronic apparatus 100A according to a second embodiment of the present invention. FIG. 12A shows the front-side appearance of the unit 20A, and FIG. 12B shows the rear-side appearance of the unit 20A.

Like the above-described units 20 (FIGS. 6A and 6B), in the illustrated embodiment, the multiple units 20A are mounted parallel to each other in the shelf part 101 of the electronic apparatus 100A as shown in FIG. 7 according to this embodiment.

The unit 20A shown in FIGS. 12A and 12B is, for instance, a power supply unit to be mounted in a computer main body. The unit 20A includes the single cooling fan 18 (FIG. 9) to provide the cooling redundancy function. The unit 20A includes the inlet 13 formed in the front face 12, the outlet 15 formed in the rear face 14 opposite the front face 12, and the single cooling fan 18. The cooling fan 18 draws in cooling air from outside through the inlet 13 and expels the air to and through the outlet 15, thereby cooling the circuit board 11 (FIG. 9) in the unit 20A. The unit 20A further includes the cooling redundancy openings 16h formed in the corresponding third faces 16 different from the front face 12 and the rear face 14.

In the case of the unit 20A shown in FIGS. 12A and 12B, each of the side face 16-1, the upper face 16-2, and the side face 16-3 has the corresponding cooling redundancy opening 16h formed therein. Further, in the case of stacking the multiple units 20A one over the other, cooling effect can be further increased by forming the cooling redundancy opening 16h in a lower face 16-4 of each unit 20A.

With the multiple units 20A being mounted in the shelf part 101 of the electronic apparatus 100A, the cooling redundancy openings 16h are formed in a part of each unit 20A which part is not closed by the adjacent unit 20A or the inner wall part of the electronic apparatus 100A so that the space inside each unit 20A constantly communicates with the space (outside the unit 20A) inside the shelf part 101 of the electronic apparatus 100A through the cooling redundancy openings 16h.

In the embodiment shown in FIGS. 12A and 12B, each of the side face 16-1, the upper face 16-2, and the side face 16-3 of the unit 20A has the corresponding cooling redundancy opening 16h formed therein. Each cooling redundancy opening 16h comprises multiple small holes through which the space inside the unit 20 communicates with the space (outside the unit 20) inside the shelf part 101 of the electronic apparatus 100A.

Electronic apparatuses receiving multiple units may be different in internal configuration or shelf internal shape depending on their types. Accordingly, the cooling redundancy openings 16h may be closed by the adjacent units or the inner wall part of the electronic apparatuses.

In order to solve this problem, the unit 20A of this embodiment has the three cooling redundancy openings 16h formed respectively in the side face 16-1, the upper face 16-2, and the side face 16-3, which are different from the front face 12 and the rear face 14. That is, with the multiple units 20A being mounted in the shelf part 101 of the electronic apparatus 100A, at least one of the redundancy cooling openings 16h of each unit 20A is prevented from being closed by the adjacent unit 20A or the inner wall part of the electronic apparatus 100A so that the space inside each unit 20A communicates with the space (outside the unit 20) inside the shelf part 101 through the unclosed cooling redundancy opening 16h. Accordingly, the unit 20A according to this embodiment can solve the above-described problem in the case of being mounted in different types of electronic apparatuses.

Figure 13:
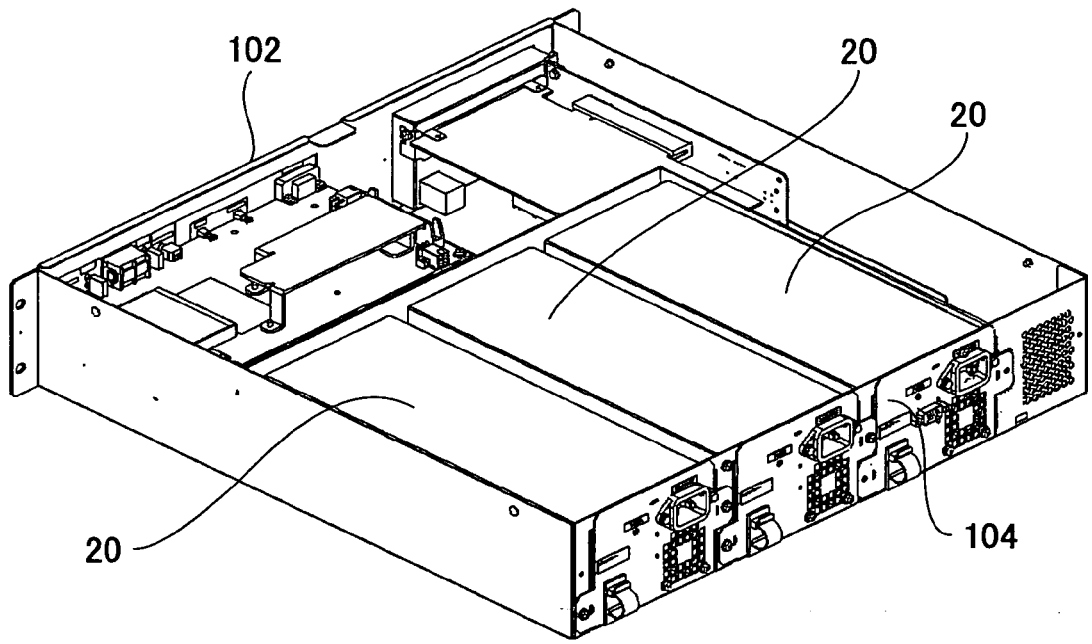
FIG. 13 is a perspective view of another configuration of the multiple units mounted in an electronic apparatus according to a third embodiment of the present invention.

FIG. 13 is a perspective view of another configuration of the multiple units 20 mounted in an electronic apparatus 100B according to a third embodiment of the present invention.

In the electronic apparatus 100B of FIG. 13, the three units 20 are mounted in the same shelf part 101 so that each adjacent two of the units 20 are disposed parallel to each other. As shown in FIG. 9, each unit 20 has the single cooling fan 18 attached thereto. The cooling redundancy openings 16h are formed in the corresponding third faces 16 different from the face on which the cooling fan 18 is attached (the rear face 14) and the face in which the inlet 13 is formed (the front face 12). The opening 101h (FIG. 6) for letting in cooling air is formed in the shelf part 101 of the electronic apparatus 100B at a position corresponding to a corresponding one of the cooling redundancy openings 16h. This opening 101h may comprise multiple small holes as the cooling redundancy openings 16h. The space inside each unit 20 communicates with the space inside the shelf part 101 through the cooling redundancy openings 16h formed in the third faces 16 (16-1 and 16-3 as shown in FIGS. 8A and 8B) different from the rear face 14 and the front face 12 of the unit 20. As shown in FIG. 6, the shelf part inlets 103, which are formed in the front-side end face of the shelf part 101, communicate with the outside of the electronic apparatus 100B through the other internal mechanism of the electronic apparatus 100B. That is, the space inside the shelf part 101 communicates with the outside of the electronic apparatus 100B through the shelf part inlets 103. Meanwhile, the internal space of each unit 20 communicates with the outside of the shelf part 101 via the cooling redundancy openings 16h, the inlet 13, and the outlet 15 of the unit 20.

Further, when one of the cooling fans 18 fails, the unit 20 with the failed cooling fan 18 can obtain greater cooling effect as the number of units 20 mounted in the same shelf part 101 of the electronic apparatus 100B increases. As a result, it is possible to reduce loads imposed on the other units 20 whose cooling fans 18 are operating normally. Compared with the electronic apparatus 100A of FIG. 7, the number of units 20 mounted in the shelf part 101 is increased in the electronic apparatus 100B of FIG. 13. Accordingly, the electronic apparatus 100B can obtain greater cooling effect inside the unit having the failed cooling fan 18, so that the loads imposed on the other units 20 whose cooling fans 18 are operating normally can be further reduced.

Further, as described above, electronic apparatuses receiving multiple units may be different in internal configuration or shelf internal shape depending on their types. In order to solve a problem in that the cooling redundancy openings 16h are closed by the adjacent units or the inner wall part of the electronic apparatuses, the multiple units 20A (FIGS. 12A and 12B), instead of the multiple units 20 (FIGS. 8A and 8B), may be mounted in the shelf part 101 of the electronic apparatus 100B so that each adjacent two of the units 20A are disposed parallel to each other.

Figure 14:
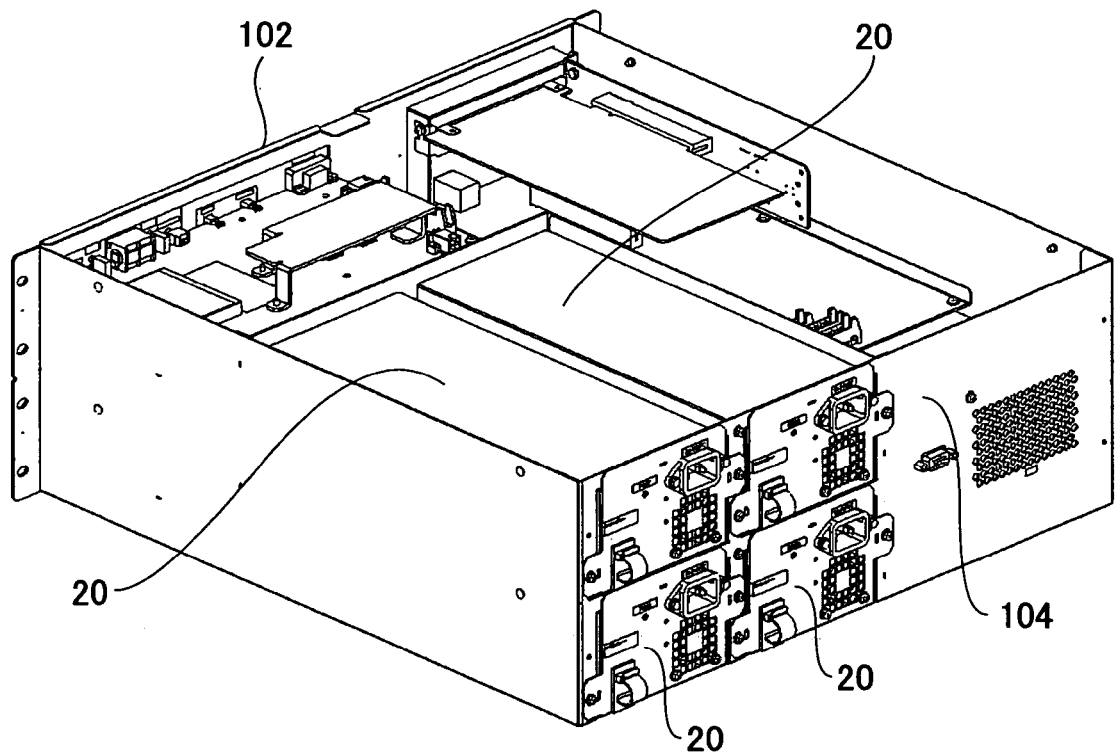
FIG. 14 is a perspective view of yet another configuration of the multiple units mounted in an electronic apparatus according to a fourth embodiment of the present invention.

FIG. 14 is a perspective view of yet another configuration of the multiple units 20 mounted in an electronic apparatus 100C according to a fourth embodiment of the present invention.

In the electronic apparatus 100C of FIG. 14, the four units 20 are mounted in two layers in the same shelf part 101 so that the adjacent units 20 are disposed parallel to each other in each layer. As shown in FIG. 9, each unit 20 has the single cooling fan 18 attached thereto. The cooling redundancy openings 16h are formed in the corresponding third faces 16 different from the face on which the cooling fan 18 is attached (the rear face 14) and the face in which the inlet 13 is formed (the front face 12). The opening 101h (FIG. 6) for letting in cooling air is formed in the shelf part 101 of the electronic apparatus 100C at a position corresponding to a corresponding one of the cooling redundancy openings 16h. This opening 101h may comprise multiple small holes as the cooling redundancy openings 16h. The space inside each unit 20 communicates with the space inside the shelf part 101 through the cooling redundancy openings 16h formed in the third faces 16 (16-1 and 16-3 as shown in FIGS. 8A and 8B) different from the rear face 14 and the front face 12 of the unit 20. As shown in FIG. 6, the shelf part inlets 103, which are formed in the front-side end face of the shelf part 101, communicate with the outside of the electronic apparatus 100C through the other internal mechanism of the electronic apparatus 100C. That is, the space inside the shelf part 101 communicates with the outside of the electronic apparatus 100C through the shelf part inlets 103. Meanwhile, the internal space of each unit 20 communicates with the outside of the shelf part 101 via the cooling redundancy openings 16h, the inlet 13, and the outlet 15 of the unit 20.

Further, when one of the cooling fans 18 fails, the unit 20 with the failed cooling fan 18 can obtain greater cooling effect as the number of units 20 mounted in the same shelf part 101 of the electronic apparatus 100C increases. As a result, it is possible to reduce loads imposed on the other units 20 whose cooling fans 18 are operating normally. Compared with the electronic apparatus 100A of FIG. 7 and the electronic apparatus 100B of FIG. 13, the number of units 20 mounted in the shelf part 101 is increased in the electronic apparatus 100C of FIG. 14. Accordingly, the electronic apparatus 100C can obtain greater cooling effect inside the unit 20 having the failed cooling fan 18, so that the loads imposed on the other units 20 whose cooling fans 18 are operating normally can be further reduced.

Further, as described above, electronic apparatuses receiving multiple units may be different in internal configuration or shelf internal shape depending on their types. In order to solve a problem in that the cooling redundancy openings 16h are closed by the adjacent units or the inner wall part of the electronic apparatuses, the units 20A (FIGS. 12A and 12B) each with the cooling redundancy opening 16h being additionally formed in the lower face may replace the two units 20 of the upper layer of the four units 20 mounted in the shelf part 101 of the electronic apparatus 100C in the configuration of FIG. 14.

As described above, according to the present invention, in an electronic apparatus receiving two or more units in a shelf part thereof, an opening through which the space inside each unit communicates with the space inside the shelf part is formed in one or more third faces of the unit, the third faces being different from the front and rear faces of the unit. As a result, it is possible to reduce the number of cooling fans mounted in each unit to one while ensuring the cooling redundancy function for the multiple units. Accordingly, it is possible to realize an electronic apparatus reduced in size, noise, and price while maintaining its high reliability. There is no need to attach a cooling fan for redundancy to each unit as a method of providing the cooling redundancy function for the multiple units mounted in the electronic apparatus. Therefore, an electronic apparatus reduced in price, size, and noise can be realized with simple structure. In the case of a large-scale computer system, it is possible to avoid system failure even if several cooling fans fail simultaneously. Thus, a low-cost electronic apparatus with a highly reliable cooling redundancy function can be provided.

The present invention is not limited to the specifically disclosed embodiments, and variations and modifications may be made without departing from the scope of the present invention.

The present application is based on and claims the benefit of Japanese Priority Patent Application No. 2004-244053, filed on Aug. 24, 2004, the entire contents of which are hereby incorporated by reference.

What is claimed is:

1. An electronic apparatus, comprising:
   a shelf part;
   a plurality of units mounted in the shelf part, each unit including:
      first and second faces opposite each other, the first face having an inlet and the second face having an outlet;
      a cooling fan configured to cool a circuit board inside the unit by letting in cooling air from outside through the inlet and letting out the cooling air through the outlet; and
      a third face different from the first and second faces, the third face having an opening so that a space inside the unit communicates with a space inside the shelf part through the opening.

2. The electronic apparatus as claimed in claim 1, wherein the third face of each unit comprises a plurality of faces different from the first and second faces, the plurality of faces each having the opening.

3. The electronic apparatus as claimed in claim 1, wherein each adjacent two of the units are disposed parallel to each other.

4. The electronic apparatus as claimed in claim 1, wherein when the cooling fan of one of the units fails, the circuit board inside the one of the units is cooled through the space inside the shelf and the opening using the cooling fans of the other units.

5. The electronic apparatus as claimed in claim 1, wherein the units are mounted in a plurality of layers in the shelf so that each adjacent two of the units are disposed parallel to each other in each of the layers.

6. The electronic apparatus as claimed in claim 1, wherein the opening comprises multiple holes.

7. A unit to be mounted in a shelf of an electronic apparatus, comprising:
   first and second faces opposite each other, the first face having an inlet and the second face having an outlet;
   a cooling fan configured to cool a circuit board inside the unit by letting in cooling air from outside through the inlet and letting out the cooling air through the outlet; and
   a third face different from the first and second faces, the third face having an opening so that a space inside the unit communicates with a space outside the unit through the opening.

8. The unit as claimed in claim 7, wherein the opening comprises multiple holes.

* * * * *